United States Patent [19]

Horie

[11] Patent Number: 5,278,102
[45] Date of Patent: Jan. 11, 1994

[54] SOI DEVICE AND A FABRICATION PROCESS THEREOF

[75] Inventor: Hiroshi Horie, Kawasaki, Japan

[73] Assignee: Fujitsu Limited, Kawasaki, Japan

[21] Appl. No.: 17,444

[22] Filed: Feb. 12, 1993

Related U.S. Application Data

[62] Division of Ser. No. 745,761, Aug. 16, 1991, abandoned.

[30] Foreign Application Priority Data

Aug. 18, 1990 [JP] Japan .................................. 2-217852

[51] Int. Cl.⁵ .................. H01L 21/465; H01L 29/34
[52] U.S. Cl. .................................. 437/228; 437/67;
437/78; 437/90; 437/109; 437/182; 437/243;
257/510; 257/520
[58] Field of Search .................... 357/23.7, 49, 55;
257/510, 520; 437/67, 78, 90, 109, 182, 228, 243

[56] References Cited

U.S. PATENT DOCUMENTS

| | | | |
|---|---|---|---|
| 5,107,312 | 4/1992 | O'Mara et al. | 357/49 |
| 5,120,666 | 6/1992 | Gotou | 437/90 |

OTHER PUBLICATIONS

Horie (1990 Symposium on VLSI Technology) Jun. 1990.

*Primary Examiner*—Edward Wojciechowicz
*Attorney, Agent, or Firm*—Staas & Halsey

[57] ABSTRACT

A method for fabricating a semiconductor device comprises the steps of forming a depression on a substrate, bonding a plate of a single crystal semiconductor material on the substrate to establish a contact such that a closed space is formed in the substrate in correspondence to the depression, reducing the thickness of the plate, forming a penetrating opening through the plate in communication to the space to form a bridging part in the plate as a region left from the formation of the penetrating opening, forming an insulation film to cover at least a lower major surface and both side walls of the bridging part, filling the space by depositing polysilicon through the penetrating opening, providing a conductivity to the polysilicon that fills the space, removing the polysilicon that has been deposited on the upper surface of the bridging part to expose a crystal surface of the semiconductor material forming the plate, and forming an active device on the bridging part.

11 Claims, 6 Drawing Sheets

SOI DEVICE AND A FABRICATION PROCESS THEREOF

This application is a division of application No. 07/745,761, filed Aug. 16, 1991, now abandoned.

BACKGROUND OF THE INVENTION

The present invention generally relates to semiconductor devices, and more particularly to an SOI (silicon-on-insulator) device that is suitable for integration on a common substrate with improved breakdown voltage.

The use of so-called SOI devices is expanding particularly for devices that are required to have a high breakdown voltage. For example, the SOI devices are used commonly for display drivers. Further, a SOI devices are suited for use in the radiation environment. Even in the applications of SOI devices, there is a persisting demand to increase the operational speed of the device.

Generally, the SOI devices are formed on a layered semiconductor body that includes a silicon substrate, a silicon oxide insulation formed on the substrate and an active layer that is formed on the silicon oxide insulation layer. Such a structure can be formed by bonding a single crystal silicon layer, acting as the active layer on the oxide insulation that in turn is formed on the silicon substrate, at a high temperature. Particularly, when the thickness of the silicon oxide insulation layer is reduced, the device shows various advantageous features such as the elimination of so-called short channel effect, the improvement of output current, and the like. Thus, efforts are made to reduce the thickness of the silicon oxide insulation layer.

In such SOI devices, however, there is a tendency that a punch-through current flows from the source to the drain, particularly when the thickness of the silicon oxide insulation layer is thin and a large drain voltage is applied. This is believed to be caused by the potential of the silicon substrate that is located under the silicon oxide insulation layer. Because of the reduced thickness of the silicon oxide insulation layer, the potential of the silicon substrate acts as the gate voltage and the current flows unwantedly from the source to the drain along the bottom surface of the active layer. In order to eliminate this so-called backchannel effect, application of a bias voltage to the substrate is proposed to eliminate the conduction along the bottom surface of the silicon active layer.

Referring to FIG. 1 showing a typical SOI device 10, the device 10 comprises an n-channel MOS transistor formed on a silicon active layer 11 that in turn is formed on a silicon oxide insulation 12, and the silicon oxide insulation 12 is formed on a silicon substrate 13. Further, the silicon substrate 13 is applied with a bias voltage $V_{bias}$ such that no punch-through current flows from a source 11a to the drain 11b along the channel formed along the insulation layer 12.

In the n-channel MOS transistor, a positive voltage is used as the bias voltage $V_{bias}$. This conventional construction, however, has an obvious problem of inapplicability to the CMOS devices wherein n-channel MOS transistors and p-channel MOS transistors are formed on a common substrate. In order to achieve this, one requires a complex structure and hence a complex process.

Further, such a conventional SOI device has suffered from a problem of leakage current flowing along the silicon oxide layer 12. It should be noted that the silicon oxide layer 12 is exposed to the environment for a long time after it is formed on the surface of the silicon substrate 13. Thereby, there is a tendency of the silicon oxide layer collect impurities on the surface thereof, and such impurities degrade the quality of the interface between the silicon oxide layer 12 and the silicon layer 11 formed thereon.

SUMMARY OF THE INVENTION

Accordingly, it is an object of the present invention to provide a novel and useful SOI device and a fabrication process, wherein the foregoing problems are eliminated.

Another and more specific object of the present invention is to provide an SOI device and a fabrication process therefore, wherein each device is formed on a polysilicon well that is formed on an SOI substrate in correspondence to each device region and with an isolation from each other. According to the present invention, the polysilicon well is used for the back gate for eliminating the backchannel effect. As each polysilicon well is isolated from each other, one can apply suitable biasing voltages even in the CMOS devices according to the type of the device.

Another object of the present invention is to provide an SOI device comprising a substrate having an insulator layer formed thereon, said insulator layer being formed with a depression in correspondence to a region where an active device is to be formed, a semiconductor plate provided on the insulator layer as a lid covering the depression, said semiconductor plate serving for an active layer of the active device, a first insulating film formed on a bottom surface of the semiconductor plate in correspondence to a part that covers the depression, a penetrating opening provided on the semiconductor plate in correspondence to the part that covers the depression, a second insulating film that covers a side wall of the penetrating opening, a polysilicon region that fills the depression, and an active device formed on the semiconductor plate that is located on the depression. According to the present invention, a back gate for eliminating the backchannel effect is provided by the polysilicon region that fills the depression. As the polysilicon region is exposed to the surface of the semiconductor plate via the penetrating opening, one can apply a desired biasing voltage to eliminate the punch-through occurring in the active device. Thereby, the breakdown voltage of the active device is significantly improved. As the polysilicon region is isolated from the polysilicon regions for other devices, one can apply different biasing voltages to the polysilicon regions of different active devices. Thus, one can eliminate the backchannel effect for both the p-channel MOS devices and n-channel MOS devices that are formed on the common substrate. The present invention is particularly advantageous for improving the breakdown characteristics of CMOS devices that are formed on the SOI substrate.

Another object of the present invention is to provide a process for fabricating an SOI device comprising the steps of forming an insulation layer on a semiconductor substrate, removing a part of the insulation layer to form a depression in the insulation layer, bonding another silicon substrate on the insulation layer to form a closed space in the insulation layer in correspondence to the depression, reducing the thickness of the second silicon substrate to form a thin plate of single crystal silicon, providing a penetrating opening through the thin plate of single crystal silicon in communication with the space, forming a thin film of silicon oxide to cover at least the surface of the thin plate of single crystal silicon, filling the space by depositing polysilicon through the penetrating opening, removing the polysilicon covering the surface of the thin plate of single crystal silicon to expose a crystal surface of silicon forming the thin plate, and forming an active device on the thin plate of single crystal silicon. According to the present invention, one can fabricate a plurality of active devices on respective polysilicon wells that are isolated from each other on a common silicon substrate, with an isolation from the corresponding polysilicon wells. Thereby, one can apply a desired bias voltage with desired polarities to the polysilicon wells, and the breakdown of the device is effectively prevented.

Other objects and further features of the present invention will become apparent from the following detailed description when read in conjunction with the attached drawings.

DETAILED DESCRIPTION

Figure 1:
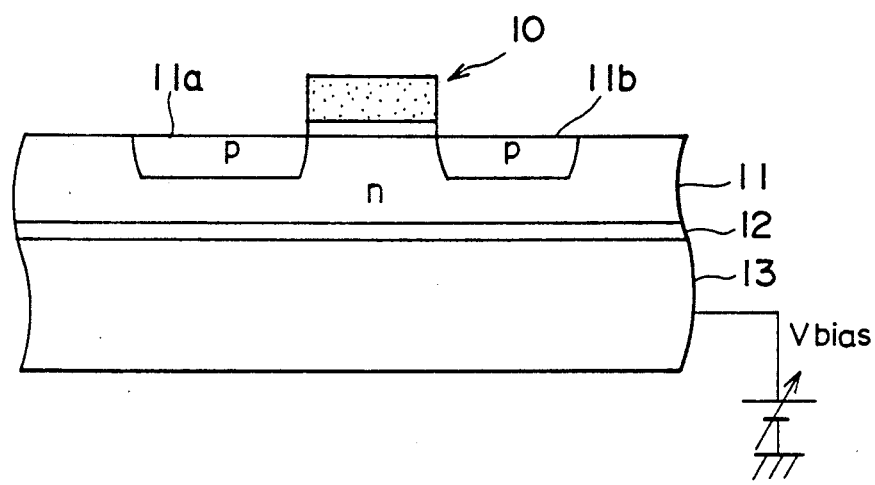
FIG. 1 is a diagram showing a conventional art for improving the breakdown voltage in a typical SOI device.
Figure 2A:
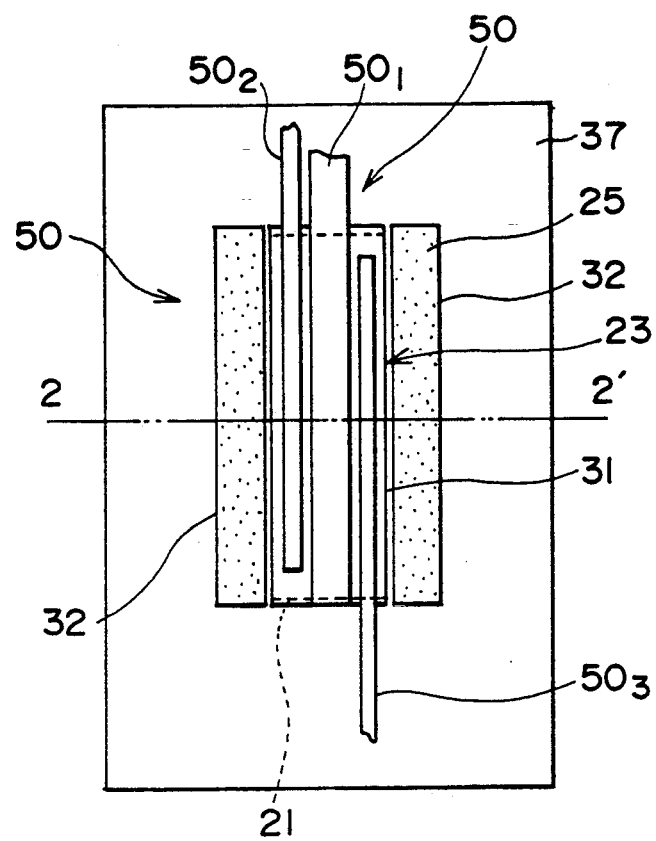
FIGS. 2(A) and 2(B) are diagrams showing the SOI device according to a first embodiment of the present invention respectively in plan view and cross sectional view.
Figure 2B:
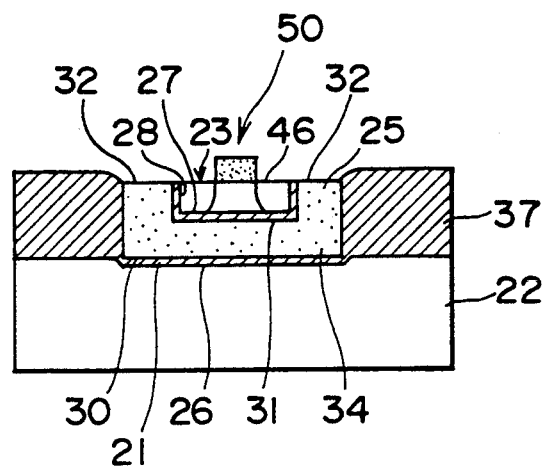

FIGS. 2(A) and 2(B) show the SOI device according to a first embodiment of the present invention, respectively in the plan view and in the cross sectional view.

Referring to the drawings, the device is constructed on an SOI substrate that in turn includes a silicon substrate 22 and a silicon oxide layer 37 that is formed on the silicon substrate 22. The silicon substrate 22 has a substantially flat upper major surface, and the silicon oxide layer 37 is formed on this flat upper majot surface of the substrate 22 with a thickness of about 1 μm.

In the silicon oxide layer 37, there is provided a depression 21 in correspondence to the region where the active device is formed. The depression 21 may have a size of 14 μm × 14 μm and extends generally through the entire thickness of the oxide layer 37. The depression 21 is characterized by a flat bottom surface that is substantially flush with the upper major surface of the substrate 22, and the bottom surface is bounded by a thin film 26 of silicon oxide that is formed in the substrate 22 along the upper major surface thereof in continuation with the silicon oxide layer 37.

Bridging across the depression 21, a single crystal silicon plate 23 is provided to extend as shown in FIGS. 2(A) and 2(B), wherein the plate 23 extends vertically in the plan view of FIG. 2(A). Thereby, it should be noted that openings 32 are left at both sides of the silicon bridging part 23. Typically, the opening 32 has a lateral dimension of 2 μm × 14 μm. The silicon bridging part 23 has a thickness of about 100 nm and is covered by an oxide film 31 at the bottom surface and by an oxide film 28 at both side walls. Further, an active device such as a MOS transistor is formed on the bridging part 23 of single crystal silicon. In the plan view, a gate electrode $50_1$ is shown to extend vertically on the upper major surface of the bridging part 23 in correspondence to the channel region of MOS transistors, and source and drain electrodes $50_2$ and $50_3$ are contacted to the source and drain regions that are formed at both sides of the channel region.

It should be noted that the depression 21 thus formed is filled by polysilicon as shown by a reference numeral 25. Thereby, the silicon bridging part 23 is insulated with respect to the polysilicon region 25 by the silicon oxide films 27 and 28 that covers the bottom and both side walls of the silicon bridging part 23. Further, the polysilicon region 25 is isolated with respect to the silicon substrate 22 and hence with respect to other devices.

In such a MOS device, one can eliminate the undesirable breakdown of the device by applying an appropriate bias voltage to the polysilicon region 25. Thereby, the polysilicon region 25 acts as a back gate. It should be noted that either a positive or a negative bias voltage can be applied to each polysilicon region 25, as each polysilicon region 25 is isolated from other polysilicon regions of other devices. The device of the present invention is particularly effective for the CMOS devices by independently biasing the back gate for the p-channel MOS transistors and n-channel MOS transistors. This point will be addressed later in detail. Further, the SOI device of the present invention has a preferable feature of reduced accumulation of impurities at the surface of the oxide films 27 and 28 that cover the bottom and side walls of the bridging part 23. It should be noted that the surfaces of the oxide films 27 and 28 is covered, immediately after they are formed, by the polysilicon filling the region 25. Thereby, one can reduce the leakage current that flows along the surface of the oxide insulator layer in the SOI device.

Next, the process for forming the device of FIGS. 2(A) and 2(B) will be described, with reference to FIGS. 3(A)-3(I).

Referring to FIG. 2(A), a single crystal silicon wafer having a diameter of 4 inches and a thickness of 500 μm is prepared as the substrate 22, and a silicon oxide layer 37' is formed on the top surface of the substrate 22 by annealing at 1000° C. in a wet O₂ environment for 400 minutes. Thereby, the oxide layer 37' grows to a thickness of about 1 μm. The substrate 22 thus formed with the oxide layer 37' is subjected to a patterning process, wherein the part of the oxide layer 37' that corresponds to the region where the SOI device 50 is to be formed is removed by a wet etching process, using an etching solution of hydrofluoride (HF). Alternatively, the etching may be achieved by an RIE process using CHF₃ as the etchant. As a result of the patterning, a depression is formed in the silicon oxide layer 37' in correspondence to the depression 21 of FIG. 2(B). The size of the depression 21 is of course not limited to the foregoing size of 14 μm × 14 μm but any other size may be used depending on the type and performance of the device to be formed.

Figure 3A:
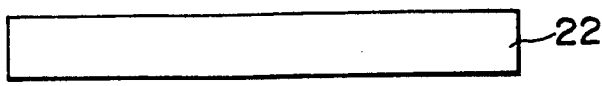
FIGS. 3(A)-3(I) are diagrams showing the steps for fabricating the first embodiment device of the present invention.

Next, another silicon wafer 23' of undoped single crystal silicon is placed on the structure thus formed in the step of FIG. 3(A), and the wafer 23' is bonded to the silicon oxide layer 37' by the Pulse Feed-assisted Bonding process. There, the structure is heated to a temperature of about 1000° C. by an infrared heating process for 30 minutes in the vacuum environment while contacting the wafer 23' to the surface of the silicon oxide layer 37' intimately. As the result, a structure shown in FIG. 3(C) is formed, wherein a closed space 21A is formed in correspondence to the depression 21. In this process, it is preferable to form an oxide film (not shown) on the surface of the wafer 23' with a thickness of about 50 nm to protect the wafer 23' from contamination. Such an oxide film may be formed easily by heating the wafer 23' at 1000° C. for 70 minutes in a dry oxygen environment.

Next, the silicon wafer 23' is subjected to a mechanical grinding process, wherein the thickness of the wafer 23' is reduced to about 2 $\mu$m. The thickness of the wafer 23' is reduced further to about 1 $\mu$m by a polishing process that may be achieved by using a polyurethane pad and colloidal silica abrasives. The wafer 23' thus reduced in the thickness is then subjected to a thermal oxidation process conducted at 1000° C. in the wet $O_2$ environment for several hundred minutes. In this oxidation process, the silicon wafer 23' is converted to silicon oxide, starting from the surface and proceeding to the interior, and only an extremely thin single crystal layer is left after the oxidation. The oxide film thus formed in the oxidation process is then removed selectively by a selective etching process that may be an RIE process. For example, a mixture of $BCl_2$ and $Cl_2$ may be used for this purpose. Thereby, the thickness of the wafer 23' is further reduced to about 160 nm and the structure shown in FIG. 3(D) is obtained.

Figure 3B:
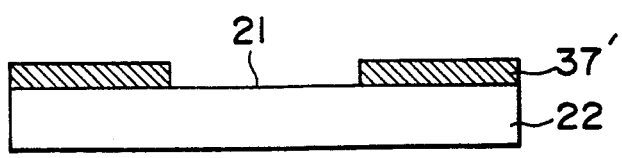
Figure 3C:
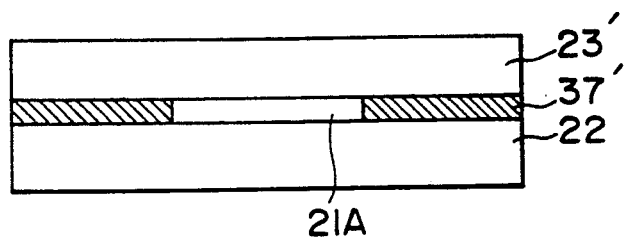
Figure 3D:
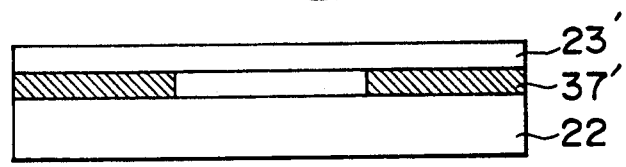
Figure 3E:
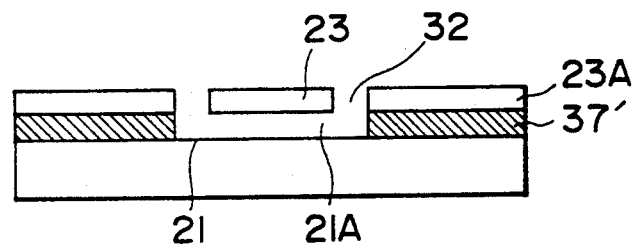

Next, a photoresist is applied on the wafer 23' of FIG. 3(D) and, after patterning the same, the openings 32 are formed to penetrate through the wafer 23' by etching. See the structure of FIG. 3(E). In response to the formation of the opening 32, the thin bridging part 23 of single crystal silicon described with reference to FIGS. 2(A) and 2(B) is formed to bridge across the depression 21. In the structure of FIG. 3(E), the single crystal silicon wafer 23' remains on the silicon oxide layer 37' as a silicon region 23A. It should be noted that the process for forming the openings 32 may be made before the wafer 23' is thinned out to the thickness of about 160 nm.

After the structure of FIG. 3(E) is formed, the exposed surface of the silicon bridging part 23 as well as the region 23A are covered by a thin oxide film by applying a thermal annealing process that may be conducted at 1000° C. for several tens of minutes in a dry oxygen atmosphere. It should be noted that, during this thermal oxidation process, the bottom surface as well as the side walls of the silicon bridging part 23 are covered by the silicon oxide films 27 and 28 shown in FIG. 2(B). Further, the upper major surface of the silicon bridging part 23 is covered by a silicon oxide film 29. The silicon oxide films 27 and 28 this formed are extremely pure and have a quality equivalent to that of a silicon oxide film that is used for the gate oxide of MOS transistors. Simultaneously with the formation of the oxide films 27 and 28, the exposed surface of the substrate 22 is covered by a silicon oxide film that corresponds to the oxide film 26. In addition to the formation of the oxide films 26–28, the side wall and the top surface of the silicon region 23A are covered by oxide films 23A' and 23A", reflectively. Typically, the silicon oxide films 26–29 as well as the oxide films 23A' and 23A" are formed in a thickness of 10–30 nm, preferably about 10 nm.

Next, a deposition of polysilicon into the space 21A is conducted via the openings 32. The deposition is performed at 620° C. in a reduced pressure environment of 0.4 Torr while flowing silane ($SiH_4$). Typically, the deposition is made at a deposition rate of 10 nm/min until the space 21A is completely filled with polysilicon. See the structure of FIG. 3(F). During the process of deposition, the polysilicon may be doped to the p-type or n-type with the carrier concentration level of $10^{20}$ cm$^{-3}$. When doping the polysilicon region 25 to the p-type during the deposition, arsine ($AsH_3$) may be added to the silane source gas. On the other hand, when the polysilicon region 25 is to be doped to the p-type, diborane ($B_2H_6$) may be added. Of course, this doping may be made after the formation of the polysilicon region 25 is completed. The SEM observation of the cross section of the structure thus obtained clearly shows that the space 21A is completely filled with polysilicon. No void is observed. It should be noted that, as a result of the deposition of polysilicon for forming the polysilicon region 25, a polysilicon layer 25' is formed as shown in FIG. 3(E).

Figure 3F:
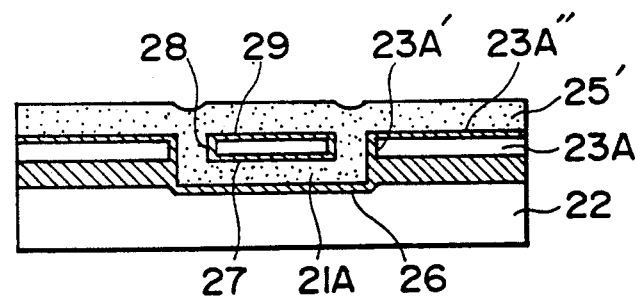

Next, the structure of FIG. 3(F) is subjected to an etch-back process until the polysilicon layer 25' and the underlying oxide films 29 and 23A" are removed. This etch-back process may for example be achieved by an RIE process using a mixture of $BCl_3$ and $Cl_2$. Thereby, the structure shown in FIG. 3(G) is obtained wherein the single crystal surface of the silicon bridging part 23 is exposed.

Figure 3G:
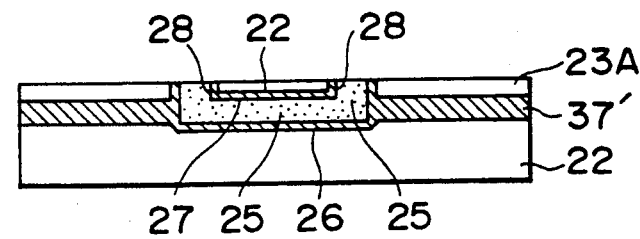

Further, the surface of the silicon bridging part 23 as well as the exposed surface of the polysilicon region 25 are protected by a silicon nitride mask and the structure of FIG. 3(G) is subjected to a thermal oxidation process at 1000° C. for several tens of minutes under the wet $O_2$ environment. Thereby, the single crystal silicon layer 23A remained in the structure of FIG. 3(G) is entirely converted to silicon oxide, and the thick silicon oxide layer 37 described previously with reference to FIG. 2(B) is formed as shown in FIG. 3(H).

Figure 3H:
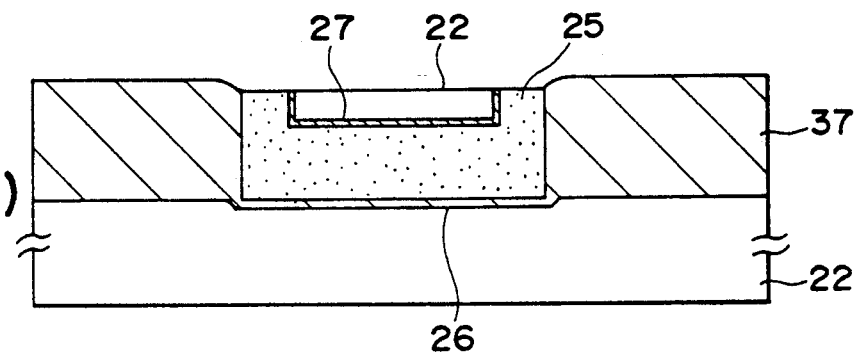

After the structure of FIG. 3(H) is formed, the SOI device is formed in the silicon bridging part 23. Thereby, the silicon bridging part 23 acts as the silicon active layer of the SOI device that is formed on the silicon oxide insulator layer. In the present case, the silicon oxide layer 27 acts for the insulator layer. The process for forming the device is a usual one, and an active device such as the MOS transistor 50 is formed.

When forming the MOS transistor, the silicon bridging part 23 is doped to the p-type or n-type by the ion implantation process depending on the type of the MOS transistor to be formed. For example, when forming an n-channel MOS transistor for the device 50, the ion implantation of boron is employed with the carrier concentration level of $10^{17}$cm$^{-3}$. On the other hand, when forming a p-channel MOS transistor, the ion implantation of phosphorus is employed with the same carrier concentration level.

Next, a gate oxide film 50a is formed of a thickness of 10–30 nm, and a polysilicon gate electrode 50b is formed on the gate oxide film 50a by a CVD process. Further, the polysilicon gate electrode is doped to the p-type or n-type with the impurity concentration level of $10^{20}$cm$^{-3}$. After a photolithographic patterning of the gate electrode 50b using the RIE process, the silicon bridging part 23 is subjected to an ion implantation process of phosphorus or boron made through the gate oxide film 50a, and source and drain regions 50c and 50d are formed at both sides of the gate electrode with the dose of $10^{20}$cm$^{-2}$. After the ion implantation, an annealing process is applied at 900° C. for about 20 minutes in the nitrogen atmosphere to activate the impurities in the source and drain regions 50c and 50d. Thereby, the structure of FIG. 3(I) is obtained.

Figure 3I:
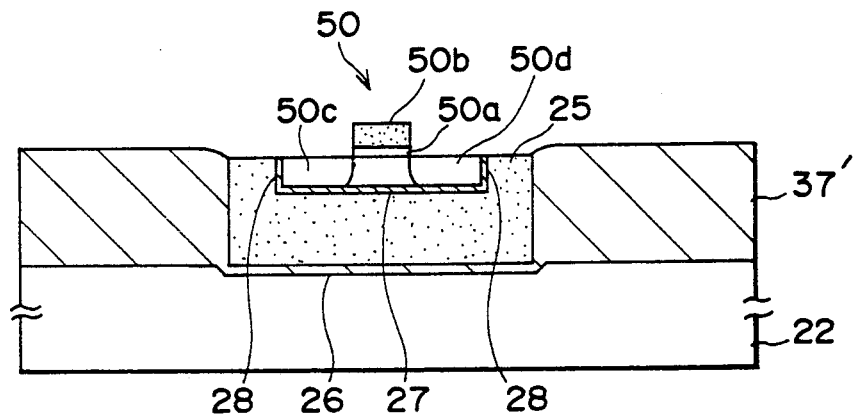

Further, an insulation layer of silicon oxide is deposited on the entire structure of FIG. 3(I) by a CVD process with the thickness of about 500 nm, and contact holes are formed in the silicon oxide layer thus formed in correspondence to the source, drain and gate regions, as usual. Finally, an aluminum layer is deposited and patterned subsequently. Thus, the MOS device 50 is formed on the silicon bridging part 23. As already mentioned, the MOS device thus formed has an SOI structure, as the silicon bridging part 23 is isolated by the silicon oxide films 27 and 28 that cover the bottom and side walls of the bridging part 23.

Figure 4:
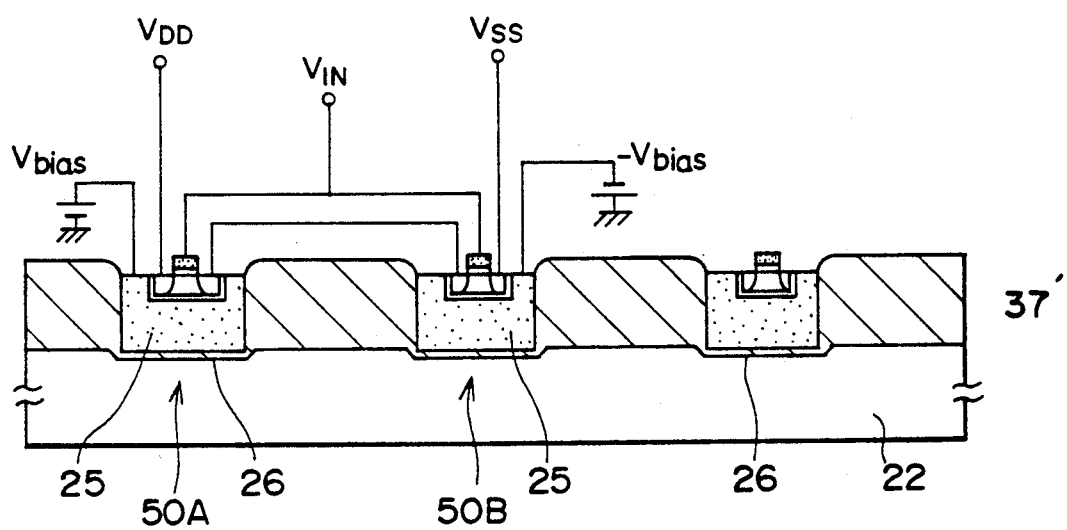
FIG. 4 is a diagram showing a CMOS inverter wherein the present invention is employed.

It should be noted that one can form a number of such SOI devices on the same substrate 22. FIG. 4 shows an example of a CMOS device, wherein a p-channel MOS transistor 50A and an n-channel MOS transistor 50B are connected in series to form an inverter. In this circuit, the polysilicon region 25 of the device 50A is biased by a positive bias voltage to eliminate the breakdown. On the other hand, the polysilicon region 25 of the device 50B is biased by a negative bias voltage to prevent the device from breakdown. As the polysilicon region 25 of each device is isolated from each other, any desired bias voltage can be used according to the type of the device. Thus, the construction of the present invention is particularly well-suited for CMOS devices.

Figure 5:
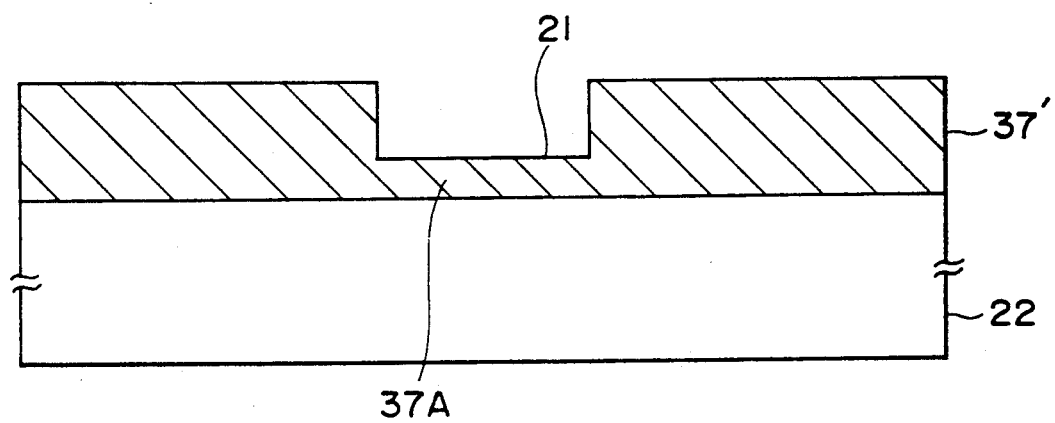
FIG. 5 is a diagram showing a modification of the process of FIGS. 3(a)-3(I)

FIG. 5 shows a modification of the process of FIGS. 3(B), wherein the formation of the depression 21 by the etching of the silicon oxide layer 37' is interrupted before the surface of the substrate 22 is exposed. In this modification, a part 37A of silicon oxide remains at the bottom of the depression 21 and the formation of the silicon oxide film 26 at the upper major surface of the substrate 22 is not necessary. Typically, the layer 37A has a thickness of about 2000 Å. According to the present construction, the silicon oxide layer 37A remains in the device 50 that is obtained in the process described heretofore. As the thickness of the oxide layer 37A is substantially larger than the thickness of the oxide film 26, one can reduce the parasitic capacitance between the polysilicon region 26 and the substrate 22 substantially.

FIGS. 6(A)–6(F) show the process according to a second embodiment of the present invention.

Figure 6A:
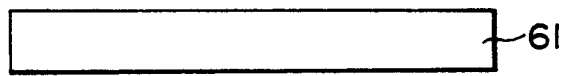
FIGS. 6(A)-6(G) are diagrams showing the steps for fabricating the SOI device according to a second embodiment of the present invention.
Figure 6B:
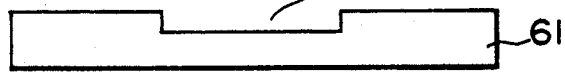
Figure 6C:
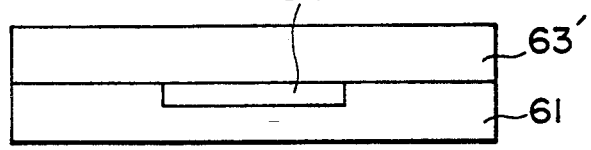

Referring to the drawings, a silicon single crystal substrate 61 is prepared in the step of FIG. 6(A), and a depression 62 is formed in the step of FIG. 6(B) with a depth of about 1 μm. Next, a silicon substrate 63' is attached on the surface of the substrate 61 and an infrared heating process is applied as already described with reference to the first embodiment. Thereby, a closed space 64 is formed as shown in FIG. 6(C).

Figure 6D:

Next, in the step of FIG. 6(D), the thickness of the substrate 63' is reduced by grinding, polishing and etching. Thereby, a thin silicon plate 63 is formed. Further, penetrating openings 65 are formed in the silicon plate 63 to communicate to the space 64 as shown in FIG. 6(E), and the silicon plate 63 is divided into regions 63A and 63B, wherein the region 63A extends to bridge across the space 64.

Figure 6E:
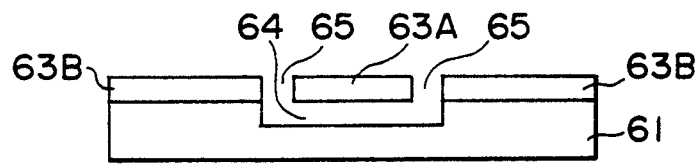
Figure 6F:
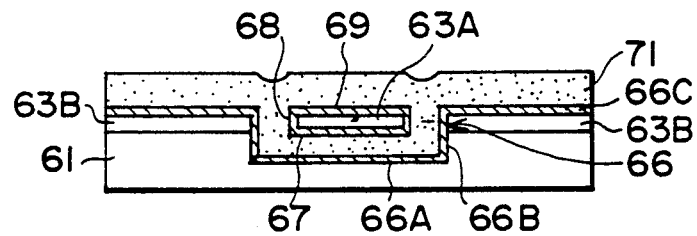
Figure 6G:
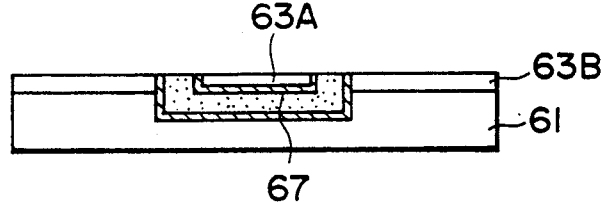

Further, the structure of FIG. 6(E) is subjected to an oxidation process, wherein oxide films 66A–66C are formed to cover the exposed surface of the substrate 61, the side wall of the space 64 including the side wall of the region 63B, and the surface of the silicon plate region 63B. Further, oxide films 67–69 are formed to cover the exposed surface of the bridging region 63A of single crystal silicon. Furthermore, polysilicon is deposited through the openings 65 to fill the space 64 and a structure shown in FIG. 6(F) is obtained. There, a polysilicon layer 71 is formed on the surface of the structure of FIG. 6(E) and fills the space 64. By removing the excessive polysilicon layer 71 and the silicon oxide film 69 by the etch-back process, one obtains the structure of FIG. 6(G). On the structure of FIG. 6(G), the devices such as the MOS device 50 are formed similar to the first embodiment.

Further, the present invention is not limited to the embodiments described heretofore, but various variations and modifications may be made without departing from the scope of the invention.

What is claimed is:

1. A method for fabricating a semiconductor device, comprising the steps of:

forming a depression on an upper major surface of a substrate, said depression having a bottom surface and side walls and extending from said upper major surface toward a lower, opposing major surface of the substrate;

bonding a plate of a single crystal semiconductor material having upper and lower major surfaces and characterized by a first thickness, on the upper major surface of the substrate to establish a contact thereto such that a closed space is formed in the substrate in correspondence to said depression;

reducing the thickness of said plate from the first thickness to a second, smaller thickness;

forming a penetrating opening through said plate in communication to said space to form a bridging part in said plate in correspondence to a part that is located on said space as a region left from the formation of the penetrating opening, such that the bridging part is defined by upper and lower major surfaces and a side wall;

after said step of reducing the thickness of the plate being achieved and after said step of providing the penetrating opening through said plate being achieved, forming an insulation film of an insulating material to cover at least said lower major surface and both side walls of said bridging part;

filling said space by depositing polysilicon through the penetrating opening;

doping said polysilicon filling said space to a desired conductivity, removing the polysilicon that has been deposited on the upper major surface of the bridging part to expose a crystal surface of the semiconductor material forming said plate at the upper major surface of the bridging part; and forming an active device on said bridging part.

2. A method as claimed in claim 1 in which said step of forming the insulation film comprises a step of forming the insulation film on the bottom surface and the side walls of the depression.

3. A method as claimed in claim 2 in which said substrate comprises a semiconductor material, and said step of forming the insulation film comprises a step of a thermal oxidation of the semiconductor material forming the substrate.

4. A method as claimed in claim 1 in which said step of forming the depression comprises a step of forming an insulation layer having upper and lower major surfaces on a semiconductor layer having upper and lower major surfaces, such that the upper major surface of the insulation layer coincides to the upper major surface of the substrate and the lower major surface of the semiconductor layer coincides to the lower major surface of the substrate, and a step of forming said depression in said insulation layer.

5. A method as claimed in claim 4 in which said step of forming said depression comprises etching the insulation layer such that the bottom surface of said depression is located above he bottom surface of the insulation layer.

6. A method as claimed in claim 4 in which said step of forming said depression comprises etching the insulation layer so as to expose the upper major surface of the semiconductor layer as the bottom surface of the depression.

7. A method as claimed in claim 6 in which said step of forming the insulation film comprises a step of covering the exposed upper major surface of the semiconductor layer by an insulation film.

8. A method as claimed in claim 7 in which said step of forming the insulation film comprises step of thermal oxidation of the exposed upper major surface of the semiconductor layer.

9. A method as claimed in claim 1 in which said step of filling the space by depositing polysilicon is performed by a CVD process of silane at a reduced pressure.

10. A method as claimed in claim 9 in which said step of doping said polysilicon comprises a step of admixing a source gas of a dopant with the silane.

11. A method as claimed in claim 1 in which said step of forming the penetrating opening is performed after performing said step of reducing the thickness of said plate.

* * * * *

UNITED STATES PATENT AND TRADEMARK OFFICE
CERTIFICATE OF CORRECTION

PATENT NO. : 5,278,102
DATED : January 11, 1994
INVENTOR(S) : HORIE

It is certified that error appears in the above-indentified patent and that said Letters Patent is hereby corrected as shown below:

Col. 1, line 14, after "expanding" insert --,--;
line 17, change "a" to --the--;
line 18, change "the" to --a--.

Col. 2, line 2, after "of" insert --a--;
line 7, after "layer" insert --to--.

Col. 5, line 9, change "the" to --a-- and change "a" to --the--.

Col. 8, line 58, change "," to --;--.

Col. 9, line 19, change "he" to --the--.

Col. 10, line 9, after "comprises" insert --a--.

Signed and Sealed this

Eighteenth Day of October, 1994

Attest:

BRUCE LEHMAN

*Attesting Officer*     *Commissioner of Patents and Trademarks*